(12) United States Patent
Nagata et al.

(10) Patent No.: US 12,235,574 B2
(45) Date of Patent: *Feb. 25, 2025

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Yuya Nagata, Tokyo (JP); Daijiro Akagi, Tokyo (JP); Kenichi Sasaki, Tokyo (JP); Hiroaki Iwaoka, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,846

(22) Filed: Jan. 24, 2024

(65) Prior Publication Data

US 2024/0160096 A1  May 16, 2024

Related U.S. Application Data

(63) Continuation of application No. PCT/JP2023/023537, filed on Jun. 26, 2023.

(30) Foreign Application Priority Data

Jul. 5, 2022 (JP) ................................. 2022-108643
May 11, 2023 (JP) ................................. 2023-078399

(51) Int. Cl.
*G03F 1/24* (2012.01)
*G03F 1/48* (2012.01)

(52) U.S. Cl.
CPC . *G03F 1/24* (2013.01); *G03F 1/48* (2013.01)

(58) Field of Classification Search
CPC .................................................... G03F 1/22–24
See application file for complete search history.

(56) References Cited

U.S. PATENT DOCUMENTS

| | | | |
|---|---|---|---|
| 11,914,284 B2* | 2/2024 | Akagi | G03F 1/48 |
| 12,001,134 B2* | 6/2024 | Nagata | G03F 1/26 |

(Continued)

FOREIGN PATENT DOCUMENTS

| | | | |
|---|---|---|---|
| JP | 2009200423 A | * | 9/2009 |
| JP | 2018-146945 A | | 9/2018 |

(Continued)

OTHER PUBLICATIONS

Office Action dated Sep. 19, 2023, in Japanese Patent Application No. 2023-551682 (with English Translation) (11 pages).

(Continued)

*Primary Examiner* — Martin J Angebranndt
(74) *Attorney, Agent, or Firm* — Oblon, McClelland, Maier & Neustadt, L.L.P.

(57) ABSTRACT

A reflective mask blank includes a substrate; a multilayer reflective film that reflects EUV light; a protection film that protects the multilayer reflective film; and a phase shift film that shifts a phase of the EUV light. The substrate, the multilayer reflective film, the protection film, and the phase shift film are arranged in this order. The phase shift film is made of an Ir-based material containing Ir as a main component, and the protection film is made of a Rh-based material containing Rh as a main component.

22 Claims, 5 Drawing Sheets

(56) References Cited

U.S. PATENT DOCUMENTS

| | | | |
|---|---|---|---|
| 2002/0027974 A1* | 3/2002 | Ezaki | G03F 1/22 |
| | | | 378/145 |
| 2019/0384158 A1 | 12/2019 | Ikebe et al. | |
| 2021/0341828 A1 | 11/2021 | Liu et al. | |
| 2022/0035234 A1 | 2/2022 | Akagi et al. | |
| 2022/0107556 A1* | 4/2022 | Liu | G03F 1/54 |
| 2022/0299862 A1* | 9/2022 | Akagi | G03F 7/20 |
| 2023/0288794 A1* | 9/2023 | Akagi | G03F 1/48 |
| 2023/0324785 A1* | 10/2023 | Kawahara | G03F 1/54 |
| | | | 430/5 |
| 2024/0045319 A1* | 2/2024 | Akagi | H01L 21/0332 |
| 2024/0094622 A1* | 3/2024 | Nagata | G03F 1/24 |

FOREIGN PATENT DOCUMENTS

| | | |
|---|---|---|
| JP | 2021-101258 A | 7/2021 |
| JP | 2021-128247 A | 9/2021 |
| JP | 2022-24617 A | 2/2022 |
| WO | WO 2021/132111 A1 | 7/2021 |
| WO | WO-2022065421 A1 * | 3/2022 ............... G03F 1/24 |
| WO | WO 2022/118762 A1 | 6/2022 |
| WO | WO 2022/138170 A1 | 6/2022 |
| WO | WO-2022138360 A1 * | 6/2022 ............... G03F 1/24 |
| WO | WO-2022138434 A1 * | 6/2022 ............... G03F 1/24 |
| WO | WO 2023/095769 A1 | 6/2023 |
| WO | WO-2024162084 A1 * | 8/2024 |

OTHER PUBLICATIONS

Decision to Grant a Patent dated Dec. 5, 2023, in Japanese Patent Application No. 2023-551682 (with English Translation) (5 pages).
International Search Report issued Aug. 29, 2023, in PCT/JP2023/023537 filed on Jun. 26, 2023 (2 pages).
International Search Report issued Jul. 25, 2023, in PCT/JP2023/023323 (with English Translation of Category of Cited Documents), citing document 15 therein, 4 pages.
Notice of Allowance dated Jan. 31, 2024, in co-pending U.S. Appl. No. 18/517,796.

* cited by examiner

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation application of International Application No. PCT/JP2023/023537, filed Jun. 26, 2023, which claims priority to Japanese Patent Applications No. 2022-108643 filed Jul. 5, 2022 and No. 2023-078399 filed May 11, 2023. The contents of these applications are incorporated herein by reference in their entirety.

BACKGROUND OF THE INVENTION

1. Field of the Invention

The disclosure herein generally relates to a reflective mask blank, a reflective mask, a method of manufacturing a reflective mask blank, and a method of manufacturing a reflective mask.

2. Description of the Related Art

Background Art

Along with the recent miniaturization of semiconductor devices, EUV lithography (EUVL), an exposure technology using Extreme Ultra-Violet (EUV) light, has been developed. The EUV light includes a soft X-ray and a vacuum ultraviolet light, and specifically has a wavelength of 0.2 nm-100 nm. At present, EUV light with a wavelength of about 13.5 nm is mainly studied.

In the EUVL, a reflective mask is used. The reflective mask includes a substrate, such as a glass substrate, a multilayer reflective film that reflects EUV light, a protection film that protects the multilayer reflective film, and a phase shift film that shifts a phase of the EUV light, in this order. An opening pattern is formed in the phase shift film. In the EUVL, the opening pattern of the phase shift film is transferred to a target substrate, such as a semiconductor substrate. The transferring includes transferring a reduced opening pattern.

The phase shift film of Japanese Unexamined Patent Application Publication No. 2018-146945 is made of an alloy containing an element selected from Group A and an element selected from Group B in order to suppress variation in phase difference due to variation in a film thickness of the phase shift film. Group A consists of Pd, Ag, Pt, Au, Ir, W, Cr, Mn, Sn, Ta, V, Fe, and Hf. Group B consists of Rh, Ru, Mo, Nb, Zr, and Y.

The protection film of Japanese Unexamined Patent Application Publication No. 2018-146945 is made of a Ru-based material containing Ru as a main component. The Ru-based material is a Ru metal simple substance, a Ru alloy containing a metal such as Nb, Zr, Y, B, Ti, La, Mo, Co, and/or Re in addition to Ru, or a nitrogen compound containing N (nitrogen) in these materials.

SUMMARY OF THE INVENTION

Problems to be Solved by the Invention

As the phase shift film, one made of an Ir-based material can be considered. The Ir-based material is a material containing Ir as a main component. Ir has a small refractive index for EUV light and a large extinction coefficient for EUV light. Therefore, by using the Ir-based material as the material of the phase shift film, the phase shift film can be made thin while securing a desired phase difference.

However, when the phase shift film is made of the Ir-based material, the etching rate of the phase shift film is low. In addition, a ratio of an etching rate of the Ir-based material constituting the phase shift film to an etching rate of the Ru-based material constituting the protection film is small. Therefore, when the opening pattern is formed in the phase shift film, the multilayer reflective film may be etched.

An aspect of the present disclosure provides a technique for improving etching selectivity between a phase shift film and a protection film when the phase shift film contains Ir as a main component.

Means for Solving the Problem

According to an aspect of the present disclosure, a reflective mask blank includes a substrate; a multilayer reflective film that reflects EUV light; a protection film that protects the multilayer reflective film; and a phase shift film that shifts a phase of the EUV light, arranged in this order. The phase shift film is made of an Ir-based material containing Ir as a main component, and the protection film is made of a Rh-based material containing Rh as a main component.

Effects of the Invention

According to an aspect of the present disclosure, when the phase shift film contains Ir as a main component, the etching selectivity between the phase shift film and the protection film can be improved.

BRIEF DESCRIPTION OF THE DRAWINGS

Other objects and further features of the present disclosure will be apparent from the following detailed description when read in conjunction with the accompanying drawings, in which.

DESCRIPTION OF THE EMBODIMENT

Figure 1:
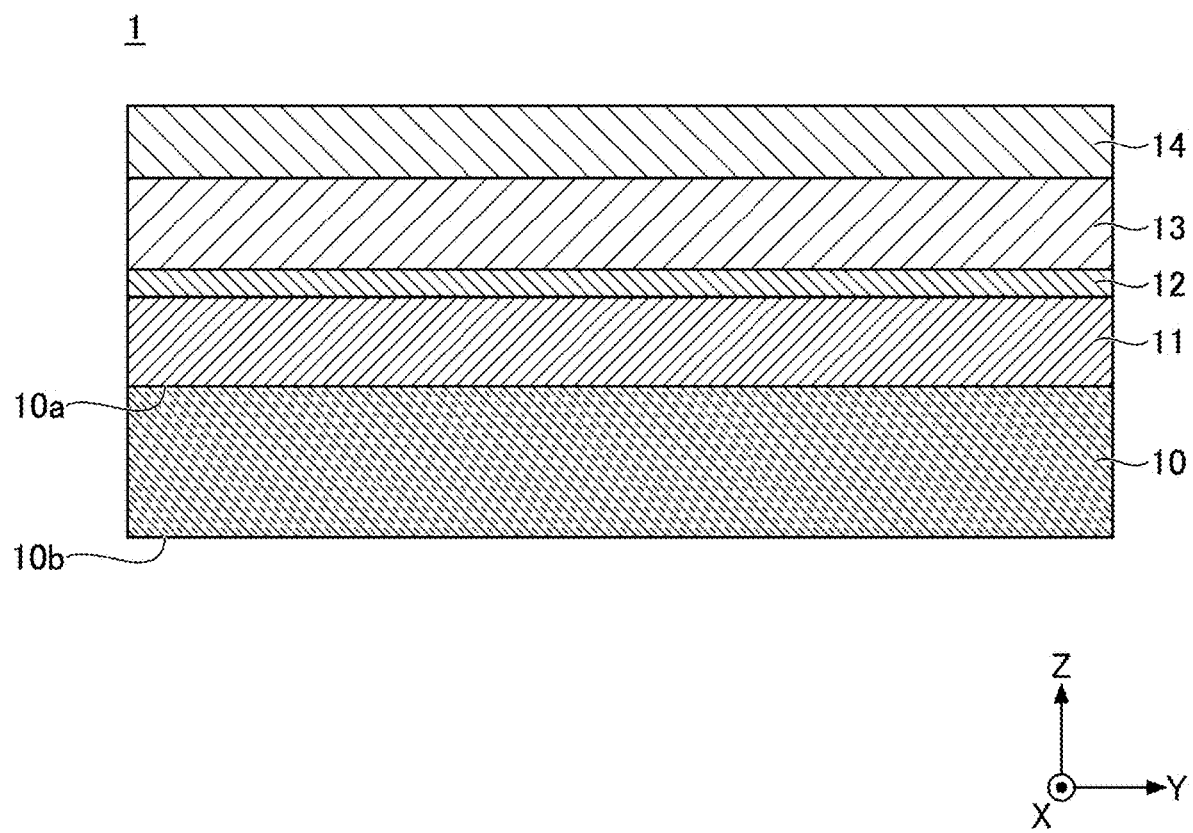
FIG. 1 is a cross-sectional view showing a reflective mask blank according to an embodiment.

In the following, embodiments of the present disclosure will be described with reference to the accompanying drawings. In each drawing, to the same or corresponding configurations, the same reference numeral will be assigned, and an explanation may be omitted. In the specification, a symbol "-" representing a numerical range indicates that values before and after the symbol are included as a lower limit value and an upper limit value, respectively.

Figure 2:
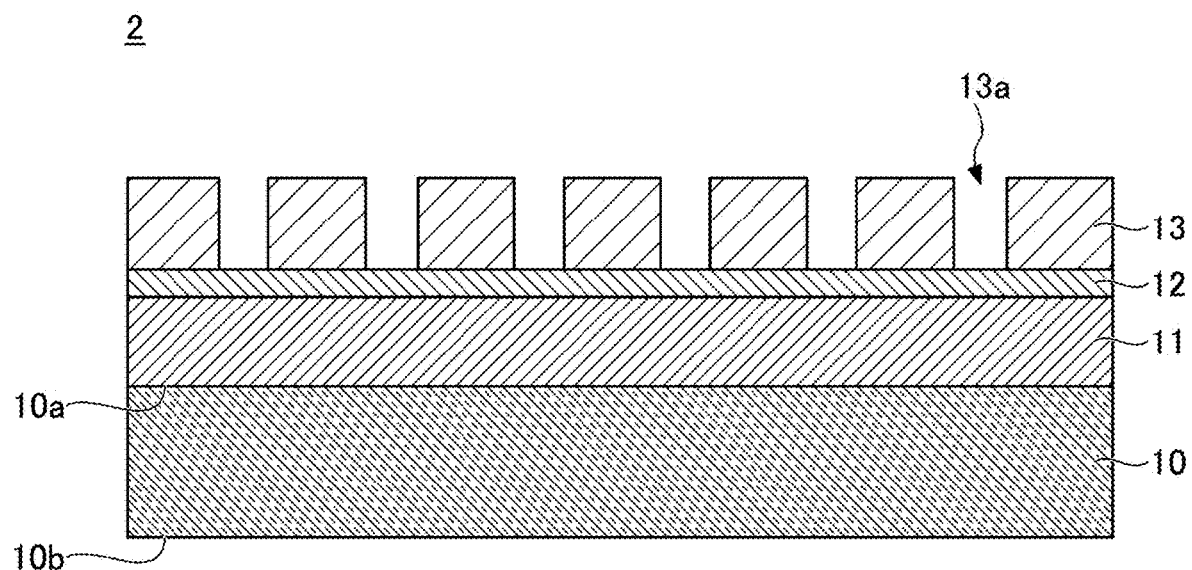
FIG. 2 is a cross-sectional view showing a reflective mask according to the embodiment.
Figure 2:
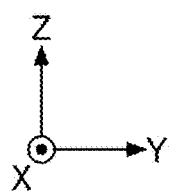
Figure 3:
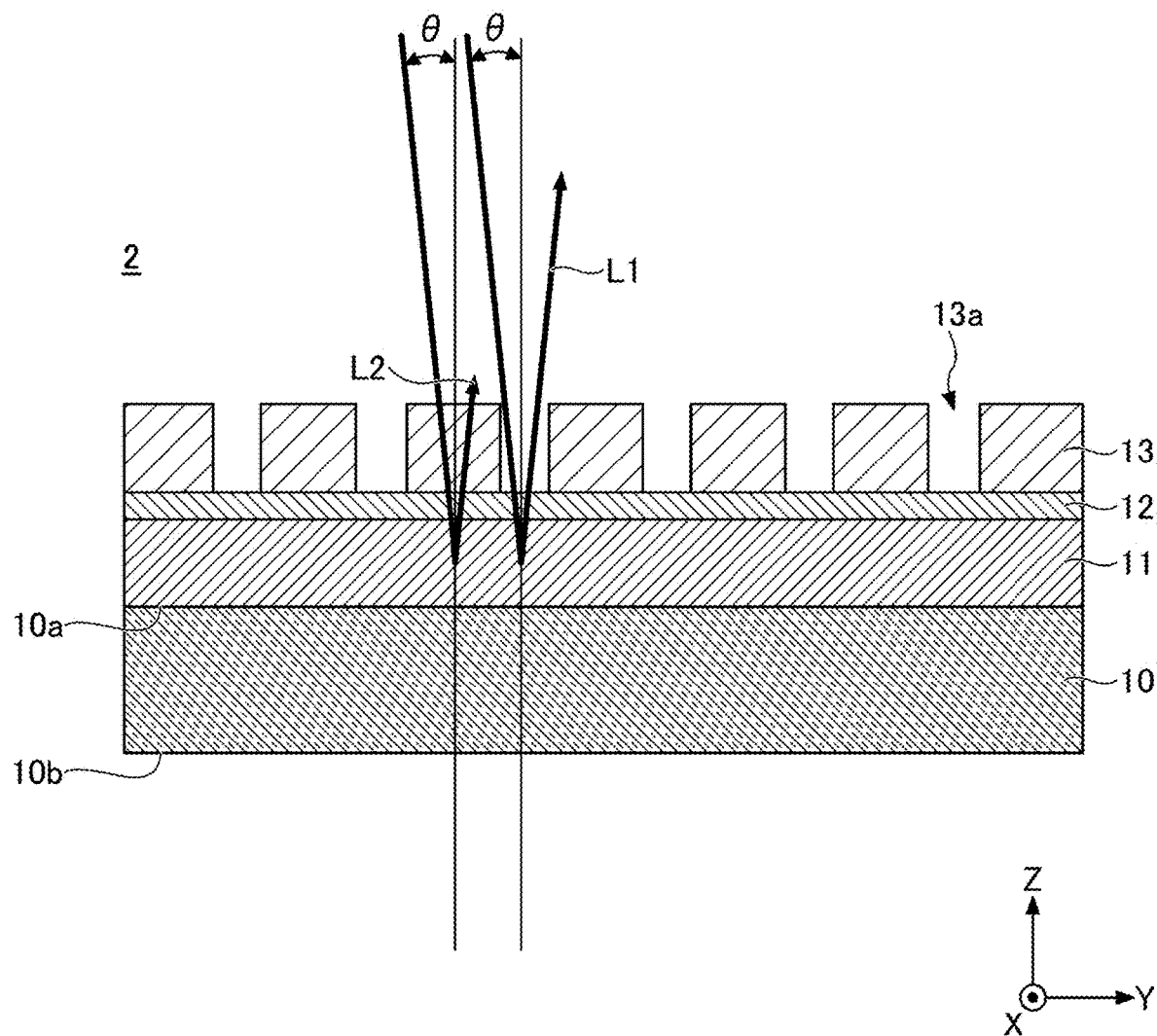
FIG. 3 is a cross-sectional view of the reflective mask for illustrating an example of EUV light reflected by the reflective mask of FIG. 2.

In FIGS. 1 to 3, an X-axis direction, a Y-axis direction, and a Z-axis direction are directions orthogonal to each other. The Z-axis direction is a direction perpendicular to a first main surface 10a of a substrate 10. The X-axis direction is a direction perpendicular to an incident plane of EUV light (a plane including an incident light beam and a reflected light beam). As shown in FIG. 3, when viewed from the X-axis direction, the incident light beam is inclined towards the Y-axis positive direction on propagating in the Z-axis negative direction, and the reflected light beam is inclined towards the Y-axis positive direction on propagating in the Z-axis positive direction.

A reflective mask blank 1 according to an embodiment will be described with reference to FIG. 1. The reflective mask blank 1 includes, for example, the substrate 10; a multilayer reflective film 11; a protection film 12; a phase shift film 13; and an etching mask film 14, in this order. The multilayer reflective film 11, the protection film 12, the phase shift film 13, and the etching mask film 14 are formed in this order on the first main surface 10a of the substrate 10. The reflective mask blank 1 only needs to have at least the substrate 10, the multilayer reflective film 11, the protection film 12, and the phase shift film 13.

The reflective mask blank 1 may further have a functional film, which is not shown in FIG. 1. For example, the reflective mask blank 1 may have a conductive film on the side opposite to the multilayer reflective film 11 with respect to the substrate 10. The conductive film is formed on a second main surface 10b of the substrate 10. The second main surface is a surface opposite to the first main surface 10a. The conductive film may be used, for example, to attract a reflective mask 2 to an electrostatic chuck of an exposure apparatus.

Although not shown, the reflective mask blank 1 may have a buffer film between the protection film 12 and the phase shift film 13. The buffer film protects the protection film 12 from an etching gas for forming an opening pattern 13a in the phase shift film 13. The buffer film is etched more moderately than the phase shift film 13. Different from the protection film 12, the buffer film ultimately has the same opening pattern as the opening pattern 13a of the phase shift film 13.

Next, the reflective mask 2 according to the embodiment will be described with reference to FIGS. 2 and 3. The reflective mask 2 is manufactured using, for example, the reflective mask blank 1 shown in FIG. 1, and includes the opening pattern 13a in the phase shift film 13. The etching mask film 14 shown in FIG. 1 is removed after the opening pattern 13a is formed in the phase shift film 13.

In EUVL, the opening pattern 13a of the phase shift film 13 is transferred to a target substrate, such as a semiconductor substrate. The transferring includes transferring a reduced opening pattern. In the following, the substrate 10, the multilayer reflective film 11, the protection film 12, the phase shift film 13, and the etching mask film 14 will be described in this order.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

The substrate 10 has the first main surface 10a and a second main surface 10b opposite to the first main surface 10a. The multilayer reflective film 11 and the like are formed on the first main surface 10a. The size of the substrate 10 in a plan view (viewed in the Z-axis direction) is, for example, 152 mm longitudinally and 152 mm laterally. The longitudinal and lateral dimensions may be greater than or equal to 152 mm. Each of the first main surface 10a and the second main surface 10b has, for example, a square-shaped quality-guaranteed region at the center thereof. The size of the quality-guaranteed region is, for example, 142 mm longitudinally and 142 mm laterally. The quality-guaranteed region on the first main surface 10a preferably has a root mean square roughness (Rq) of 0.150 nm or less and a flatness of 100 nm or less. The quality-guaranteed region of the first main surface 10a is preferably free from a defect that may cause a phase defect.

The multilayer reflective film 11 reflects EUV light. The multilayer reflective film 11 is formed by alternately stacking, for example, a high refractive index layer and a low refractive index layer. A material of the high refractive index layer is, for example, silicon (Si), and a material of the low refractive index layer is, for example, molybdenum (Mo). With this combination, the multilayer reflective film is a Mo/Si multilayer reflective film. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, a MoRu/Si multilayer reflective film, a Si/Ru/Mo multilayer reflective film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60% or more with respect to EUV light having an incident angle θ (see FIG. 3) of 6°, a Mo film having a film thickness of 2.3±0.1 nm and a Si film having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo film and the Si film, when a Mo/Si multilayer reflective film is formed by the ion beam sputtering method, will be shown as follows.

<Film Formation Condition for Si Film>
Target: Si;
Sputtering gas: Ar;
Gas pressure: 0.013 Pa-0.027 Pa;
Ion acceleration voltage: 300 V-1500 V;
Film formation rate: 0.030 nm/sec-0.300 nm/sec; and
Film thickness of Si film: 4.5±0.1 nm.

<Film Formation Condition for Mo Film>
Target: Mo;
Sputtering gas: Ar;
Gas pressure: 0.013 Pa-0.027 Pa;
Ion acceleration voltage: 300 V-1500 V;
Film formation rate: 0.030 nm/sec-0.300 nm/sec; and
Film thickness of Mo film: 2.3±0.1 nm <Repeating Unit of Si Film and Mo Film>
Number of repeating units: 30-60 (preferably 40-50).

The protection film 12 is formed between the multilayer reflective film 11 and the phase shift film 13 to protect the multilayer reflective film 11. The protection film 12 protects the multilayer reflective film 11 from the etching gas for forming the opening pattern 13a (see FIG. 2) in the phase shift film 13. The protection film 12 is not removed even when exposed to the etching gas, and remains on the multilayer reflective film 11.

The etching gas is, for example, a halogen-based gas, an oxygen-based gas, or a mixture gas thereof. The halogen-based gas includes a chlorine-based gas and a fluorine-based gas. The chlorine-based gas is, for example, a $Cl_2$ gas, a $SiCl_4$ gas, a $CHCl_3$ gas, a $CCl_4$ gas, a $BCl_3$ gas, or a mixture gas thereof. The fluorine-based gas is, for example, a $CF_4$ gas, a $CHF_3$ gas, a $SF_8$ gas, a $BF_3$ gas, a $XeF_2$ gas, or a mixture gas thereof. The oxygen-based gas is an $O_2$ gas, an $O_3$ gas), or a mixture gas thereof.

A ratio (ER2/ER1) of an etching rate ER2 of the phase shift film 13 to an etching rate ER1 of the protection film 12 is also referred to as a selection ratio (ER2/ER1). The higher the selection ratio (ER2/ER1) is, the better the processability of the phase shift film 13 is. The selection ratio (ER2/ER1) is preferably 5.0 or more, more preferably 10 or more, and still more preferably 30 or more. The selection ratio (ER2/ER1) is preferably 200 or less, and more preferably 100 or less.

The protection film 12 is made of, for example, a Rh-based material. The Rh-based material is a material containing Rh as a main component and is a material containing 50 at % to 100 at % of Rh. By combining the protection film 12 made of the Rh-based material and the phase shift film 13 made of an Ir-based material to be described later, the selection ratio (ER2/ER1) can be set to 5.0 or more. The Rh-based material preferably contains more than or equal to 50 at % and less than or equal to 100 at % of Rh, more preferably contains more than 50 at % and less than or equal to 100 at % of Rh, and still more preferably contains more than 50 at % and less than 100 at % of Rh. The Rh-based material may be a simple substance of Rh, but is preferably a Rh compound.

The protection film 12 may contain only Rh, but preferably contains a Rh compound. The Rh compound may contain at least one element Z1 selected from Ru, Pd, Y, Al, Nb, and Si in addition to Rh. By adding Pd, Y, or Al to Rh, the etching rate ER1 of the protection film 12 can be reduced, and the selection ratio (ER2/ER1) can be increased. The reflectance of the reflective mask 2 can be improved by adding Ru, Nb, or Si to Rh.

An element ratio between the element Z1 (all Z1) and rhodium (Rh), Z1:Rh, is preferably 1:99-1:1. In the specification of the present application, the element ratio means a molar ratio. When the value of the ratio Z1/Rh is 1/99 or more, the reflectance for EUV light is excellent. When the value of the ratio Z1/Rh is less than or equal to 1, the resistance of the protection film 12 to the etching gas is excellent. The element ratio between Z1 and Rh, Z1:Rh, is more preferably 3:10-1:1.

The Rh compound may contain, in addition to Rh, at least one element Z2 elected from the group consisting of N, O, C, and B. The element Z2 reduces the resistance of the protection film 12 to the etching gas, but prevents the protection film 12 from being crystallized, and can form the smooth surface of the protection film 12. The Rh compound containing the element Z2 has a non-crystalline structure or a microcrystalline structure. When the Rh compound has a non-crystalline structure or a microcrystalline structure, the X-ray diffraction profile of the Rh compound does not exhibit a clear peak.

When the Rh compound contains Z2 in addition to Rh, it is preferable that the content of Rh or the total content of Rh and Z1 is 40 at % to 99 at %, and the total content of Z2 is 1.0 at % to 60 at %. When the Rh compound contains Z2 in addition to Rh, the content of Rh or the total content of Rh and Z1 is more preferably from 80 at % to 99 at %, and the total content of Z2 is more preferably from 1.0 at % to 20 at %.

When the Rh compound contains 90 at % or more of Rh, contains at least one element selected from the group consisting of Z1 and Z2, and has a density of 10.0 $g/cm^3$ to 14.0 $g/cm^3$, the Rh compound has a non-crystalline structure or a microcrystalline structure. The density of the Rh compound is preferably 11.0 $g/cm^3$ to 13.0 $g/cm^3$. When the protection film 12 contains 100 at % of Rh and has a density of 11.0 $g/cm^3$ to 12.0 $g/cm^3$, the protection film 12 has a non-crystalline structure or a microcrystalline structure. The density of the protection film 12 is measured using an X-ray reflectance method.

The protection film 12 is composed of a single layer in the present embodiment, but may include a plurality of layers. That is, the protection film 12 may be a multilayer film having a lower layer and an upper layer. The lower layer of the protection film 12 is a layer formed in contact with the uppermost surface of the multilayer reflective film 11. The upper layer of the protection film 12 is in contact with the lowermost surface of the phase shift film 13. As described above, according to the multi-layer structure of the protection film 12, a material excellent in a predetermined function can be used for each layer, so that the entire protection film 12 can achieve multifunctionality. The protection film 12 may contain 50 at % or more of Rh as a whole, and may include a layer not containing Rh.

The upper layer of the protection film 12 preferably contains Rh, and more preferably contains a Rh compound. The lower layer of the protection film 12 preferably contains at least one element selected from the group consisting of Ru, Nb, Mo, Zr, Y, C, and B, and more preferably contains Ru. The lower layer of the protection film 12 may not contain Rh. When the protection film 12 is a multilayer film, the thickness of the protection film 12 described below means a total film thickness of the multilayer film.

The thickness of the protection film 12 is preferably greater than or equal to 1.0 nm and less than or equal to 4.0 nm, preferably greater than or equal to 1.5 nm and less than or equal to 4.0 nm, more preferably greater than or equal to 2.0 nm and less than or equal to 3.8 nm, and even more preferably greater than or equal to 2.0 nm and less than or equal to 3.5 nm. When the thickness of the protection film 12 is greater than or equal to 1.0 nm, the etching resistance is good. In addition, when the thickness of the protection film 12 is less than or equal to 4.0 nm, a decrease in the reflectance with respect to EUV light can be suppressed.

The density of protection film 12 is preferably greater than or equal to 10.0 $g/cm^3$ and less than or equal to 14.0 $g/cm^3$. When the density of the protection film 12 is greater than or equal to 10.0 $g/cm^3$, the etching resistance is good. In addition, when the density of the protection film 12 is less than or equal to 14.0 $g/cm^3$, a decrease in the reflectance with respect to EUV light can be suppressed.

The root mean square roughness (Rq) of the upper surface of the protection film 12, i.e. a surface of the protection film 12 on which the phase shift film 13 is formed, is preferably less than or equal to 0.300 nm, and more preferably less than or equal to 0.150 nm. When the root mean square roughness (Rq) is less than or equal to 0.300 nm, the phase shift film 13 or the like can be smoothly formed on the protection film 12. In addition, scattering of EUV light can be suppressed, and the reflectance with respect to the EUV light can be improved. The root mean square roughness (Rq) is preferably greater than or equal to 0.050 nm.

The method of forming the protection film 12 is, for example, a DC sputtering method, a magnetron sputtering method, or an ion beam sputtering method. When the Rh film is formed by the DC sputtering method, an example of the film formation conditions is as follows.

<Film Formation Conditions for Rh Film>
Target: Rh;
Sputtering gas: Ar;
Gas pressure: $1.0 \times 10^{-2}$ Pa to $1.0 \times 10^0$ Pa;
Power density of target: 1.0 W/cm$^2$ to 8.5 W/cm$^2$;
Film formation rate: 0.020 nm/sec to 1.000 nm/sec; and
Film thickness of Rh film: 1 nm to 10 nm.

When the Rh film is formed, a $N_2$ gas or a mixture gas of an Ar gas and a $N_2$ gas may be used as the sputtering gas. The volume ratio of a $N_2$ gas in the sputtering gas, $N_2/(Ar+N_2)$, is 0.05 or more and 1.0 or less.

The phase shift film 13 is a film in which the opening pattern 13a is to be formed. The opening pattern 13a is not formed in the manufacturing process of the reflective mask blank 1 but is formed in the manufacturing process of the reflective mask 2. The phase shift film 13 not only absorbs the EUV light but also shifts a phase of the EUV light. The phase shift film shifts a phase of second EUV light L2 with respect to a phase of first EUV light L1 shown in FIG. 3.

The first EUV light L1 is light that entered and passed through the opening pattern 13a without passing through the phase shift film 13, was reflected by the multilayer reflective film 11, and passed through the opening pattern 13a again without passing through the phase shift film 13 and exited. The second EUV light L2 is light that entered and passed through the phase shift film 13 while being absorbed by the phase shift film 13, was reflected by the multilayer reflective film 11, and passed through the phase shift film 13 while being absorbed again by the phase shift film 13 and exited.

The phase difference, which is greater than or equal to zero, between the first EUV light L1 and the second EUV light L2 is, for example, 170°-250°. A phase of the first EUV light L1 may be advanced or retarded from a phase of the second EUV light L2. The phase shift film 13 improves a contrast of a transferred image by utilizing an interference between the first EUV light L1 and the second EUV light L2. The transferred image is an image obtained by transferring the opening pattern 13a of the phase shift film 13 to a target substrate.

In EUVL, the so-called shadowing effect occurs. The shadowing effect is caused by an incident angle θ of EUV light that is not 0° (e.g. 6°), which causes a region near the side wall of the opening pattern 13a that blocks the EUV light by the side wall, resulting in a positional displacement or dimensional displacement of the transferred image. To reduce the shadowing effect, lowering the height of the side wall of the opening pattern 13a is effective, and thinning the phase shift film 13 is effective.

A film thickness of the phase shift film 13 is, for example, 60 nm or less, and preferably 50 nm or less, to reduce the shadowing effect. The film thickness of the phase shift film 13 is preferably 20 nm or more, and more preferably 30 nm or more, to ensure the phase difference between the first EUV light L1 and the second EUV light L2.

To reduce the film thickness of the phase shift film 13 to reduce the shadowing effect while ensuring the phase difference between the first EUV light L1 and the second EUV light L2, it is effective to reduce a refractive index n of the phase shift film 13. Therefore, the phase shift film 13 of the present embodiment is made of an Ir-based material. The Ir-based material is a material containing Ir as a main component, and is a material containing 50 at % to 100 at % of Ir. That is, the phase shift film 13 contains 50 at % to 100 at % of Ir.

The Ir-based material has a small refractive index n and a large extinction coefficient k. Therefore, the phase shift film 13 can be made thin while securing a desired phase difference. The larger the Ir content, the smaller the refractive index n and the larger the extinction coefficient k. The Ir content is preferably 70 at % or more, more preferably 80 at % or more.

The refractive index n of the phase shift film 13 is preferably 0.935 or less, more preferably 0.920 or less, still more preferably 0.910 or less, and particularly preferably 0.90 or less. The smaller the refractive index n of the phase shift film 13 is, the thinner the phase shift film 13 can be made. The refractive index n of the phase shift film 13 is preferably 0.885 or more. In this specification, the refractive index is a refractive index with respect to EUV light (for example, light having a wavelength of 13.5 nm).

The extinction coefficient k of the phase shift film 13 is preferably 0.030 or more, more preferably 0.032 or more, still more preferably 0.035 or more, and particularly preferably 0.037 or more. As the extinction coefficient k of the phase shift film 13 is larger, it is easier to obtain a desired reflectance with a smaller film thickness. The extinction coefficient k of the phase shift film 13 is preferably 0.065 or less. In this specification, the extinction coefficient is an extinction coefficient with respect to EUV light (for example, light having a wavelength of 13.5 nm).

The phase shift film 13 preferably contains Ir, and more preferably contains an Ir compound. The Ir compound preferably contains only Ir as a metal element, or contains at least one first element X1 selected from Ru, Ta, Cr, Re, W, V, and Mn in addition to Ir as a metal element. The optical properties can be adjusted by adding Ru to Ir. The etching properties can be improved by adding Ta, Cr, Re, W, V, or Mn to Ir. The total content of the first element X1 is preferably 1.0 at % to 49 at %.

The Ir compound preferably contains at least one second element X2 selected from O, B, C, N, and Si as a non-metal element in addition to Ir. By adding the second element X2 to Ir, it is possible to suppress crystallization while suppressing the deterioration of the optical properties and to reduce the roughness of the sidewall of the opening pattern 13a. The second element X2 preferably contains O, and more preferably contains O and N. With a small amount of oxygen added, crystallization of the Ir compound can be suppressed, and deterioration of optical properties of the Ir compound can be suppressed. The total content of the second element X2 is preferably 1.0 at % to 49 at %, more preferably 5.0 at % to 30 at %, and still more preferably 15 at % to 25 at %.

The Ir compound preferably contains O as a non-metal element in addition to Ir in an amount of more than 0 at % and 25 at % or less, more preferably 1 at % or more and 20 at % or less, still more preferably 1 at % or more and 15 at % or less, and particularly preferably 1 at % or more and 10 at % or less. When O is contained, it is possible to suppress crystallization while suppressing deterioration of optical properties, and to reduce the roughness of the sidewall of the opening pattern 13a.

The Ir compound preferably contains C as a non-metal element in addition to Ir in an amount of more than 0 at % and 15 at % or less, and more preferably 1 at % or more and 10 at % or less. When C is contained, it is possible to suppress crystallization while suppressing deterioration of optical properties, and to reduce the roughness of the sidewall of the opening pattern 13a.

The Ir compound preferably contains B as a non-metal element in addition to Ir in an amount of more than 0 at % and 15 at % or less, and more preferably contains 1 at % or more and 10 at % or less. By containing B, it is possible to suppress crystallization while suppressing deterioration of optical properties, and it is possible to reduce the roughness of the sidewall of the opening pattern 13a.

The Ir compound preferably contains Si as a non-metal element in addition to Ir in an amount of more than 0 at % and 15 at % or less, and more preferably 1 at % or more and 10 at % or less. When Si is contained, it is possible to suppress crystallization while suppressing deterioration of optical properties, and to reduce the roughness of the sidewall of the opening pattern 13a.

The Ir compound preferably contains N as a non-metal element in addition to Ir in an amount of more than 0 at % and 10 at % or less, more preferably in an amount of 1 at % or more and 8 at % or less, still more preferably in an amount of 1.5 at % or more and 6 at % or less, and particularly preferably in an amount of 1.8 at % or more and 5 at % or less. When N is contained, it is possible to suppress crystallization while suppressing deterioration of optical properties, and to reduce the roughness of the sidewall of the opening pattern 13a. In addition, by containing N, the crystallization of the Ir compound can be suppressed even with a small O content.

In the Ir compound, the total content of the first element X1 is preferably 5.0 at % to 49 at %, or the total content of the second element X2 is preferably 1.0 at % to 45 at %. In the Ir compound, when the total content of the first element X1 is less than 5.0 at % and the total content of the second element X2 is more than 45 at %, iridium oxide, which is an unstable compound to hydrogen, is generated, and the hydrogen resistance of the reflective mask blank 1 deteriorates.

In the phase shift film 13, when the second element X2 is Ta, a ratio (Ir/Ta) of an Ir content (at %) to a Ta content (at %) is, for example, 1 to 190. When the ratio (Ir/Ta) of the Ir content to the Ta content is 1 or more, the optical properties of the phase shift film 13 are good. When the ratio (Ir/Ta) of the Ir content to the Ta content is 190 or less, the processability of the phase shift film 13 is good. The ratio (Ir/Ta) of the Ir content to the Ta content is preferably 1 to 100, more preferably 1 to 40, still more preferably 2 to 30, particularly preferably 2 to 25, and most preferably 2 to 15.

In the phase shift film 13, when the second element X2 is Cr, a ratio (Ir/Cr) of an Ir content (at %) to a Cr content (at %) is, for example, 1 to 105. When the ratio (Ir/Cr) of the Ir content to the Cr content is 1 or more, the optical properties of the phase shift film 13 are good. When the ratio (Ir/Cr) of the Ir content to the Cr content is 105 or less, the selection ratio (ER2/ER1) is large, and the processability of the phase shift film 13 is good. The ratio (Ir/Cr) of the Ir content to the Cr content is preferably 1 to 105, more preferably 2 to 105, still more preferably 3 to 105, and particularly preferably 4 to 105.

In the phase shift film 13, when the second element X2 is W, a ratio (Ir/W) of an Ir content (at %) to a W content (at %) is, for example, 1 to 100. When the ratio (Ir/W) of the Ir content to the W content is 1 or more, the optical properties of the phase shift film 13 are good. When the ratio (Ir/W) of the Ir content to the W content is 100 or less, the selection ratio (ER2/ER1) is large and the processability of the phase shift film 13 is good. The ratio (Ir/W) of the Ir content to the W content is preferably 1 to 90, more preferably 2 to 80, still more preferably 3 to 70, and particularly preferably 4 to 30.

In the phase shift film 13, when the first element X1 contains O, a ratio (Ir/O) of an Ir content (at %) to an O content (at %) is, for example, 1 to 40. When the ratio (Ir/O) of the Ir content to the O content is 1 or more, the hydrogen resistance of the phase shift film 13 can be improved. When the ratio (Ir/O) of the Ir content to the O content is 40 or less, the crystallization of the phase shift film 13 can be suppressed, and the roughness of the sidewall of the opening pattern 13a can be reduced. The ratio (Ir/O) of the Ir content to the O content is preferably 1 to 40, more preferably 2 to 35, still more preferably 2 to 30, particularly preferably 2 to 20, and most preferably 3 to 15.

In the phase shift film 13, when the first element X1 contains N, a ratio (Ir/N) of an Ir content (at %) to a N content (at %) is, for example, 10 to 105. When the ratio (Ir/N) of the Ir content to the N content is 10 or more, the hydrogen resistance of the phase shift film 13 can be improved, crystallization can be suppressed, and the roughness of the sidewall of the opening pattern 13a can be reduced. When the ratio (Ir/N) of the Ir content to the N content is 105 or less, the crystallization of the phase shift film 13 can be suppressed, and the roughness of the sidewall of the opening pattern 13a can be reduced. The ratio of the Ir content to the N content (Ir/N) is preferably 10 to 105, more preferably 10 to 80, still more preferably 15 to 70, particularly preferably 20 to 68, and most preferably 20 to 45.

In the phase shift film 13, when the first element X1 contains O and N, a ratio (Ir/(O+N)) of an Ir content (at %) to a sum of an O content (at %) and a N content (at %) is, for example, 1 to 45. When the ratio (Ir/(O+N)) of the Ir content to the sum of the O content and the N content is 1 or more, the hydrogen resistance of the phase shift film 13 can be improved. When the ratio (Ir/(O+N)) of the Ir content to the sum of the O content and the N content is 45 or less, the crystallization of the phase shift film 13 can be suppressed, and the roughness of the sidewall of the opening pattern 13a can be reduced. The ratio (Ir/(O+N)) of the Ir content to the sum of the O content and the N content is preferably 1 to 45, more preferably 2 to 30, still more preferably 2.5 to 20, particularly preferably 3 to 15, and most preferably 3 to 10.

An etching rate of the phase shift film 13 by sulfuric acid/hydrogen peroxide is 0 nm/min-0.05 nm/min due to sulfuric acid/hydrogen peroxide. Sulfuric acid/hydrogen peroxide is used for removing a resist film, which will be described later, or cleaning the reflective mask 2. When the etching rate of the phase shift film 13 by sulfuric acid/hydrogen peroxide is 0.05 nm/min or less, damage to the phase shift film 13 during cleaning can be suppressed.

The method of forming the phase shift film 13 is, for example, a DC sputtering method, magnetron sputtering method, or ion beam sputtering method. An oxygen content of the phase shift film 13 can be controlled by a content of $O_2$ gas in sputtering gas. In addition, a nitrogen content of the phase shift film 13 can be controlled by a content of $N_2$ gas in the sputtering gas.

When an IrTaON film is formed by using the reactive sputtering method, an example of film formation conditions is as follows.

<Film Formation Conditions for IrTaON Film>
Targets: Ir and Ta (or IrTa);
Power density of Ir target: 1.0 W/cm$^2$ to 8.5 W/cm$^2$;
Power density of Ta target: 1.0 W/cm$^2$ to 8.5 W/cm$^2$;
Sputtering gas: a mixture of Ar gas, O$_2$ gas, and N$_2$ gas;
Volume ratio of O$_2$ gas to the sputtering gas (O$_2$/(Ar+O$_2$+Na)): 0.01 to 0.25;
Volume ratio of N$_2$ gas to the sputtering gas (N$_2$/(Ar+O$_2$+N$_2$)): 0.01 to 0.25;
Film formation rate: 0.020 nm/sec to 0.060 nm/sec; and
Film thickness: 20 nm to 60 nm.

The phase shift film 13 is composed of a single layer in the present embodiment, but may include a plurality of layers. The phase shift film 13 may have a layer not containing Ir. In any case, at least one layer constituting the phase shift film 13 is preferably made of an Ir-based material. The Ir-based material is a material containing Ir as a main component. The Ir-based material may be an Ir simple substance but is preferably an Ir compound. The phase shift film 13 may contain 50 at % or more of Ir as a whole.

A ratio (t1/t2) of a thickness t1 (nm) of the phase shift film 13 to a thickness t2 (nm) of a Rh-containing layer constituting the protection film 12 is preferably 25 or less. When the ratio (t1/t2) is 25 or less, an increase in a surface roughness of the protection film 12 due to an extension of the etching time can be suppressed. The ratio t1/t2 is preferably 25 or less, more preferably 22 or less, still more preferably 20 or less, and particularly preferably 18 or less.

A ratio (t1/t3) of a thickness t1 (nm) of the phase shift film 13 to a thickness t3 (nm) of the protection film 12 is preferably 15 or less. When the ratio (t1/t3) is 15 or less, an increase in the surface roughness of the protection film 12 due to the extension of the etching time can be suppressed. The ratio t1/t3 is preferably 15 or less, more preferably 12 or less, and still more preferably 11 or less.

The etching mask film 14 is formed on the side opposite to the protection film 12 with respect to the phase shift film 13, and is used to form an opening pattern 13a in the phase shift film 13. A resist film (not shown) is formed on the etching mask film 14. In the manufacturing process of the reflective mask 2, a first opening pattern is formed on the resist film, then a second opening pattern is formed on the etching mask film 14 using the first opening pattern, and then a third opening pattern 13a is formed on the phase shift film 13 using the second opening pattern. The first opening pattern, the second opening pattern, and the third opening pattern 13a have identical dimensions and identical shapes in a plan view (viewed along the Z-axis direction). The etching mask film 14 enables thinning of the resist film.

The etching mask film 14 preferably contains at least one element selected from Al, Hf, Y, Cr, Nb, Ti, Mo, Ta, and Si. The etching mask film 14 may further contain at least one element selected from O, N, and B.

The film thickness of the etching mask film 14 is preferably greater than or equal to 2 nm and less than or equal to 30 nm, more preferably greater than or equal to 2 nm and less than or equal to 25 nm, and still more preferably greater than or equal to 2 nm and less than or equal to 10 nm.

The method of forming the etching mask film 14 is, for example, a DC sputtering method, a magnetron sputtering method, or an ion beam sputtering method.

Figure 4:
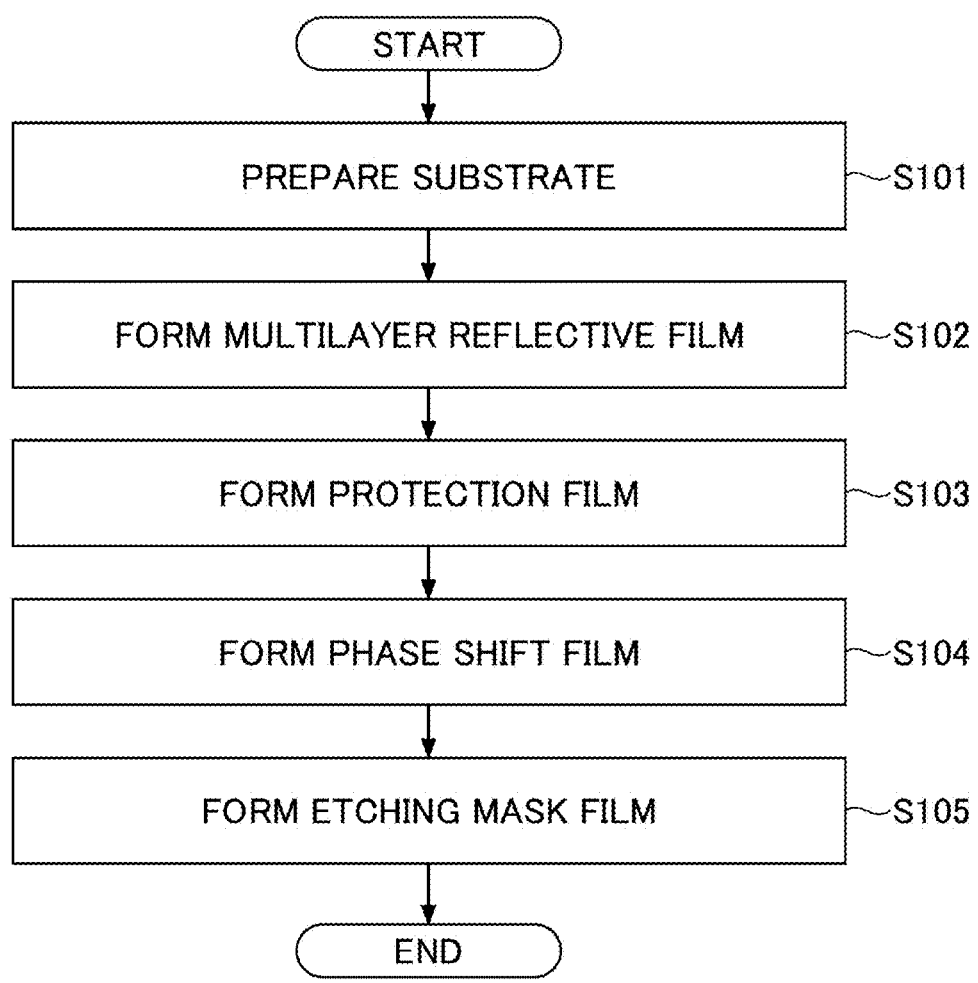
FIG. 4 is a flowchart showing a method of manufacturing a reflective mask blank according to the embodiment.

Next, a method of manufacturing the reflective mask blank 1 according to the embodiment of the present invention will be described with reference to FIG. 4. The method of manufacturing the reflective mask blank 1 has, for example, steps S101 to S105 shown in FIG. 4. A substrate 10 is prepared (step S101). A multilayer reflective film 11 is formed on a first main surface 10a of the substrate 10 (step S102). A protection film 12 is formed on the multilayer reflective film 11 (step S103). A phase shift film 13 is formed on the protection film 12 (step S104). An etching mask film 14 is formed on the phase shift film 13 (step S105).

The manufacturing method of the reflective mask blank 1 is required to have at least steps S101 to S104. The manufacturing method of the reflective mask blank 1 may further include a step of forming a functional film (not shown in FIG. 4).

Figure 5:
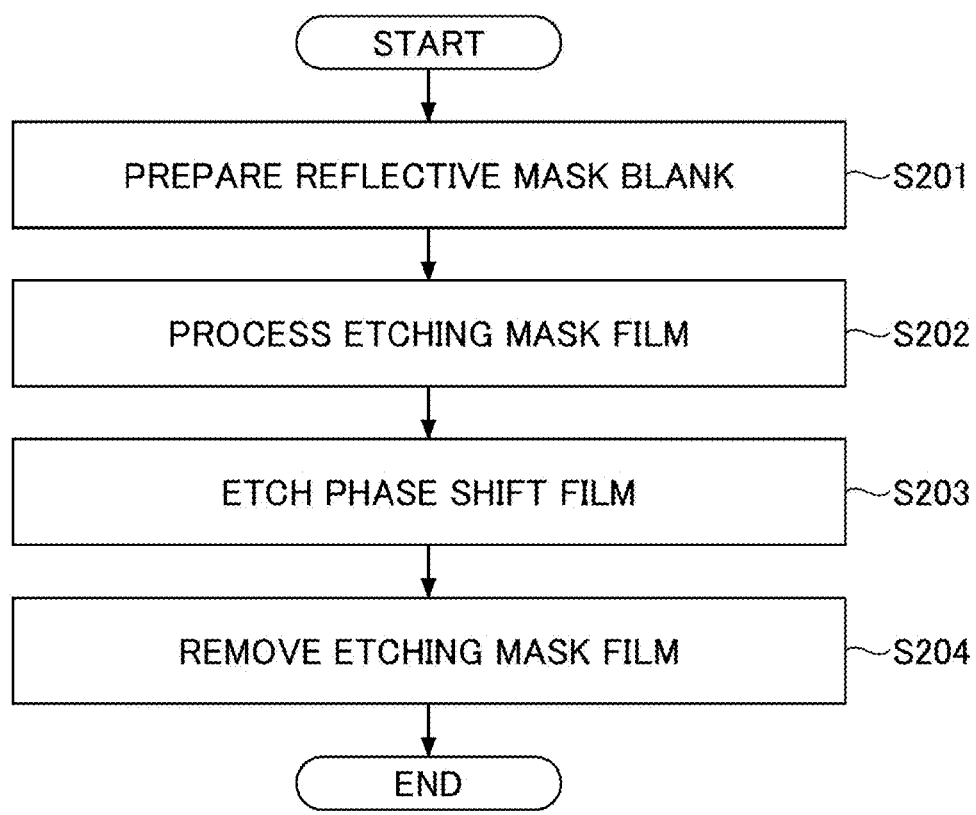
FIG. 5 is a flowchart showing a method of manufacturing a reflective mask according to the embodiment.

Next, a method of manufacturing the reflective mask 2 according to the embodiment of the present invention will be described with reference to FIG. 5. The method of manufacturing the reflective mask 2 has steps S201 to S204 shown in FIG. 5. A reflective mask blank 1 is prepared (step S201). An etching mask film 14 is processed (step S202). A resist film (not shown) is provided on the etching mask film 14. A first opening pattern is formed on the resist film, then a second opening pattern is formed on the etching mask film 14 using the first opening pattern. A third opening pattern 13a is formed on the phase shift film 13 using the second opening pattern (step S203). In step S203, the phase shift film 13 is etched using etching gas. The resist film and the etching mask film 14 are removed (step S204). The resist film is removed using, for example, sulfuric acid/hydrogen peroxide. The etching mask film 14 is removed using, for example, etching gas. The etching gas used in step S204 (to remove the etching mask film 14) may be the same type as the etching gas used in step S202 (to process the etching mask film 14). The manufacturing method of the reflective mask 2 is required to have at least steps S201 and S203.

EXAMPLES

Hereinafter, experimental data will be described.

Example 1 to Example 5

In Examples 1 to 5, reflective mask blanks for EUVL were produced under the same conditions except for the film type of the phase shift film and the film formation conditions thereof. Each reflective mask blank included a substrate, a multilayer reflective film, a protection film, and a phase shift film. Examples 1 to 5 are practical examples.

As the substrate, a SiO$_2$—TiO$_2$-based glass substrate (outer shape: a square of 6 inches (152 mm) per side and 6.3 mm thick) was prepared. The glass substrate had a thermal expansion coefficient of 0.02×10$^{-7}$/° C. at 20° C., a Young's modulus of 67 GPa, a Poisson's ratio of 0.17, and a specific stiffness of 3.07×10$^7$ m$^2$/s$^2$. A quality-guaranteed region of a first main surface of the substrate had a root-mean-square roughness (Rq) of 0.15 nm or less and a flatness of 100 nm or less by polishing. A Cr film with a thickness of 100 nm was deposited on a second main surface of the substrate by the magnetron sputtering method. A sheet resistance of the Cr film was 100 Ω/□.

As the multilayer reflective film, a Mo/Si multilayer reflective film was formed. The Mo/Si multilayer reflective film was formed by repeating 40 times deposition of a Si layer (film thickness was 4.5 nm) and a Mo layer (film thickness was 2.3 nm) using the ion beam sputtering method. The total film thickness of the Mo/Si multilayer reflective film was 272 nm ((4.5 nm+2.3 nm)×40).

As the protection film, a Rh film (film thickness was 2.5 nm) was formed. The Rh film was formed using the DC sputtering method.

As the phase shift film, an Ir film, an IrTaON film, or an IrCrON film was formed. In Example 1, the Ir film was formed using the DC sputtering method. In Examples 2 to 4, the IrTaON film was formed using the reactive sputtering method. In Example 5, the IrCrON film was formed using the reactive sputtering method.

The film types and properties of the phase shift films obtained in Examples 1 to 5 are shown in TABLE 1.

TABLE 1

| | | Composition | | | | | Optical property | | Etching property | | |
|---|---|---|---|---|---|---|---|---|---|---|---|
| | Film type | Ir [at %] | Ta [at %] | Cr [at %] | O [at %] | N [at %] | Refractive index n | Extinction coefficient k | ER2 [nm/min] | ER2/ER1 | ER2/ER1' |
| Ex. 1 | Ir | 100 | — | — | — | — | 0.905 | 0.0440 | 5.49 | 6.5 | 2.7 |
| Ex. 2 | IrTaON | 78.0 | 3.3 | — | 16.7 | 1.9 | 0.910 | 0.0417 | 5.80 | 6.9 | 2.9 |
| Ex. 3 | IrTaON | 71.4 | 6.1 | — | 20.5 | 2.0 | 0.916 | 0.0392 | 6.50 | 7.7 | 3.2 |
| Ex. 4 | IrTaON | 74.1 | 7.2 | — | 17.8 | 1.1 | 0.915 | 0.0412 | 6.20 | 7.3 | 3.1 |
| Ex. 5 | IrCrON | 80.5 | — | 0.8 | 15.4 | 3.3 | 0.914 | 0.0400 | 5.40 | 6.4 | 2.7 |

ER1: Etching rate for metal simple substance of Rh (0.85 nm/min)
ER1': Etching rate for metal simple substance of Ru (2.03 nm/min)

The composition of the phase shift film was measured using an X-ray photoelectron spectrometer (PHI 5000 VersaProbe) by ULVAC-PHI, Inc.

For the optical properties (refractive index n and extinction coefficient k) of the phase shift film, values in the database of the Center for X-Ray Optics, Lawrence Berkeley National Laboratory, or values calculated from a formula of "incident angle dependence" of reflectance, which will be described later, were used.

The incident angle θ of the EUV light, the reflectance R for the EUV light, the refractive index n of the phase shift film, and the extinction coefficient k of the phase shift film satisfy the following equation (1), $$R = \left| \frac{\sin\theta - ((n+ik)^2 - \cos^2\theta)^{1/2}}{\sin\theta + ((n+ik)^2 - \cos^2\theta)^{1/2}} \right|. \quad (1)$$

Measurements were made for the combination of the incident angle θ and the reflectance R a plurality of times, and the refractive index n and extinction coefficient k were estimated by the least squares method so that errors between the plural measurement data and the values of the equation (1) were minimized.

The etching rates ER1 and ER1' of the protection film and the etching rate ER2 of the phase shift film were measured using an inductively coupled plasma (ICP) etching apparatus. The rate ER1 is an etching rate of simple substance of Rh. The rate ER1' is an etching rate of simple substance of Ru. As an etching gas, a mixture gas of a $CF_4$ gas and an $O_2$ gas was used. Specific conditions of the inductively coupled plasma etching were as follows:

ICP antenna bias: 1650 W;
Substrate bias: 50 W;
Etching pressure: $4.0 \times 10^{-1}$ Pa;
Etching gas: mixture gas of $CF_4$ gas and $O_2$ gas;
Flow rate of $CF_4$ gas: 80 sccm; and
Flow rate of $O_2$ gas: 20 sccm.

In Examples 1 to 5, since the protection film made of a Rh-based material (specifically, a metal simple substance of Rh) and the phase shift film made of an Ir-based material were combined, the selection ratio (ER2/ER1) could be made 5.0 or more, as shown in TABLE 1. When the protection film made of a Ru-based material (specifically, a metal simple substance of Ru) and the phase shift film made of an Ir-based material were combined, the selection ratio (ER2/ER1') was less than 5.0, as shown in TABLE 1.

Example 6

The reflective mask blank for EUVL of Example 6 was produced under the following conditions. As the substrate, a $SiO_2$—$TiO_2$-based glass substrate (outer shape: a square of 6 inches (152 mm) per side and 6.3 mm thick) was prepared. The glass substrate had a thermal expansion coefficient of $0.02 \times 10^{-7}$/° C. at 20° C., a Young's modulus of 67 GPa, a Poisson's ratio of 0.17, and a specific stiffness of $3.07 \times 10^7$ m²/s². A quality-guaranteed region of a first main surface of the substrate had a root-mean-square roughness (Rq) of 0.15 nm or less and a flatness of 100 nm or less by polishing. A Cr film with a thickness of 100 nm was deposited on a second main surface of the substrate by the magnetron sputtering method. A sheet resistance of the Cr film was 100 Ω/□.

As the multilayer reflective film, a Mo/Si multilayer reflective film was formed. The Mo/Si multilayer reflective film was formed by repeating 40 times deposition of a Si layer (film thickness was 4.5 nm) and a Mo layer (film thickness was 2.3 nm) using the ion beam sputtering method. The total film thickness of the Mo/Si multilayer reflective film was 272 nm ((4.5 nm+2.3 nm)×40).

As the protection film, a Ru film (film thickness was 1.0 nm) and a Rh film (film thickness was 1.5 nm) were formed in this order. The Ru film and the Rh film were formed using the ion beam sputtering method.

As the phase shift film, an IrTaON film (film thickness was 38 nm, and Ir:Ta:O:N=69.1 at %:22.9 at %:3.1 at %:4.9 at %) was formed using the reactive sputtering method.

Example 7

In Example 7, a reflective mask blank for EUVL was produced under the same conditions as in Example 6 except that the film thickness of the Rh film included the protection film was set to 2.5 nm.

The produced reflective mask blanks for EUVL of Examples 6 and 7 were subjected to an etching test under the following conditions. The etching test was performed using the inductively coupled plasma (ICP) etching apparatus. As an etching gas, a mixture gas of a $CF_4$ gas and a $O_2$ gas was used. Specific conditions of the inductively coupled plasma etching were as follows.

ICP antenna bias: 1200 W;
Substrate bias: 50 W;
Etching pressure: 4.0×10$^{-1}$ Pa;
Etching gas: mixture gas of CF$_4$ gas and O$_2$ gas;
Flow rate of CF$_4$ gas: 48 sccm;
Flow rate of O$_2$ gas: 12 sccm; and
Etching time: 317 sec or 346 sec.

The surface roughness Ra of the protection film (specifically, the Rh film) after the etching test was measured using an atomic force microscope (AFM). The roughness Ra is an arithmetic average roughness described in JIS B0601:2013. The measurement results of the surface roughness Ra are shown in TABLE 2. In TABLE 2, an increase rate (%) of the roughness Ra is calculated using the following formula (2).

$$\text{Increase rate} = (Ra1 - Ra0)/Ra0 \times 100 \quad (2)$$

where Ra0 is the roughness Ra measured with the etching time of 317 seconds, and Ra1 is the roughness Ra measured with the etching time of 346 seconds.

As shown in TABLE 2, in Example 7, different from Example 6, the ratio t1/t2 was 25 or less, and thus an increase in the roughness Ra of the protection film due to the extension of the etching time could be suppressed.

TABLE 2

| | Example 6 | | Example 7 | |
|---|---|---|---|---|
| Film thickness of phase shift film t1 [nm] | 38.0 | | 38.0 | |
| Film thickness of Rh film t2 [nm] | 1.5 | | 2.5 | |
| Film thickness of Ru film | 1.0 | | 1.0 | |
| Sum of film thicknesses of Ru film and Rh film t3 [nm] | 2.5 | | 3.5 | |
| t1/t2 | 25.3 | | 15.2 | |
| t1/t3 | 15.2 | | 10.9 | |
| Etching time [sec] | 317 | 346 | 317 | 346 |
| Surface roughness Ra [nm] | 0.122 | 0.699 | 0.098 | 0.129 |
| Increase rate of Ra (%) | — | 472.2 | — | 31.3 |

As described above, the reflective mask blank, the reflective mask, the method of manufacturing the reflective mask blank, and the method of manufacturing the reflective mask according to the present disclosure have been described. However, the present disclosure is not limited to the above-described embodiments, and the like. Various variations, modifications, substitutions, additions, deletions, and combinations are possible within the scope of claims. They also of course fall within the technical scope of the present disclosure.

What is claimed is:

1. A reflective mask blank, comprising:
a substrate;
a multilayer reflective film that reflects EUV light;
a protection film that protects the multilayer reflective film; and
a phase shift film that shifts a phase of the EUV light formed directly on the protection film,
wherein the substrate, the multilayer reflective film, the protection film and the phase shift film are laminated in an order of the substrate, the multilayer reflective film, the protection film and the phase shift film, the phase shift film includes an Ir-based material comprising Ir as a main component, the protection film includes a Rh-based material comprising Rh as a main component, the phase shift film includes an Ir compound comprising, as a non-metal element, O and at least one element selected from the group consisting of C, N, B, and Si, the Ir compound includes O in an amount of 25 at % or less, and in the phase shift film and the protection film, a ratio ER2/ER1 of an etching rate ER2 of the phase shift film to an etching rate ER1 of the protection film is 5.0 or more.

2. The reflective mask blank according to claim 1, wherein a film thickness of the phase shift film is from 20 nm to 60 nm.

3. The reflective mask blank according to claim 1, wherein the protection film includes only Rh, or includes Rh and at least one element selected from the group consisting of Ru, Pd, Y, Al, Nb, and Si.

4. The reflective mask blank according to claim 3, wherein the protection film comprises from 50 at % to 100 at % of Rh.

5. The reflective mask blank according to claim 1, wherein a film thickness of the protection film is from 0.5 nm to 4.0 nm.

6. The reflective mask blank according to claim 1, wherein a ratio t1/t2 of a film thickness t1 of the phase shift film to a thickness t2 of a Rh-containing layer in the protection film is 25 or less.

7. The reflective mask blank according to claim 1, further comprising:
an etching mask film formed on a side opposite to the protection film with respect to the phase shift film,
wherein the etching mask film includes at least one element selected from the group consisting of Al, Hf, Y, Cr, Nb, Ti, Mo, Ta, and Si.

8. The reflective mask blank according to claim 7, wherein the etching mask film further includes at least one element selected from the group consisting of O, N, and B.

9. A reflective mask comprising the reflective mask blank according to claim 1, wherein the phase shift film includes an opening pattern.

10. A method of manufacturing a reflective mask, comprising:
preparing the reflective mask blank of claim 1; and
forming an opening pattern in the phase shift film.

11. A method of manufacturing a reflective mask blank, comprising:
forming a multilayer reflective film that reflects EUV light, a protection film that protects the multilayer reflective film, and a phase shift film that shifts a phase of the EUV light on a substrate such that the substrate, the multilayer reflective film, the protection film and the phase shift film are laminated in an order of the substrate, the multilayer reflective film, the protection film and the phase shift film and the phase shift film is formed directly on the protection film,
wherein the phase shift film includes an Ir-based material comprising Ir as a main component, the protection film includes a Rh-based material comprising Rh as a main component, the phase shift film includes an Ir compound comprising, as a non-metal element, O and at least one element selected from the group consisting of C, N, B, and Si, the Ir compound includes O in an amount of 25 at % or less, and in the phase shift film and the protection film, a ratio ER2/ER1 of an etching rate ER2 of the phase shift film to an etching rate ER1 of the protection film is 5.0 or more.

12. A reflective mask blank comprising:
a substrate;
a multilayer reflective film that reflects EUV light;
a protection film that protects the multilayer reflective film; and a phase shift film that shifts a phase of the EUV light formed directly on the protection film, wherein the substrate, the multilayer reflective film, the protection film and the phase shift film are laminated in an order of the substrate, the multilayer reflective film, the protection film and the phase shift film, the phase shift film includes an Ir-based material comprising Ir as a main component, the protection film includes a Rh-based material comprising Rh as a main component, the phase shift film includes an Ir compound comprising, as a non-metal element, N and at least one element selected from the group consisting of O, C, B, and Si, the Ir compound includes N in an amount of 10 at % or less, and in the phase shift film and the protection film, a ratio ER2/ER1 of an etching rate ER2 of the phase shift film to an etching rate ER1 of the protection film is 5.0 or more.

13. The reflective mask blank according to claim 12, wherein a film thickness of the phase shift film is from 20 nm to 60 nm.

14. The reflective mask blank according to claim 12, wherein the protection film comprises only Rh, or comprises Rh and at least one element selected from the group consisting of Ru, Pd, Y, Al, Nb, and Si.

15. The reflective mask blank according to claim 14, wherein the protection film comprises from 50 at % to 100 at % of Rh.

16. The reflective mask blank according to claim 12, wherein a film thickness of the protection film is from 0.5 nm to 4.0 nm.

17. The reflective mask blank according to claim 12, wherein a ratio t1/t2 of a film thickness t1 of the phase shift film to a thickness t2 of a Rh-containing layer included in the protection film is 25 or less.

18. The reflective mask blank according to claim 12, further comprising:

an etching mask film on a side opposite to the protection film with respect to the phase shift film, wherein the etching mask film comprises at least one element selected from the group consisting of Al, Hf, Y, Cr, Nb, Ti, Mo, Ta, and Si.

19. The reflective mask blank according to claim 18, wherein the etching mask film further comprises at least one element selected from the group consisting of O, N, and B.

20. A reflective mask comprising the reflective mask blank according to claim 12, wherein the phase shift film includes an opening pattern.

21. A method of manufacturing a reflective mask, comprising:

preparing the reflective mask blank of claim 12; and forming an opening pattern in the phase shift film.

22. A method of manufacturing a reflective mask blank, comprising:

forming a multilayer reflective film that reflects EUV light, a protection film that protects the multilayer reflective film, and a phase shift film that shifts a phase of the EUV light on a substrate such that the substrate, the multilayer reflective film, the protection film and the phase shift film are laminated in an order of the substrate, the multilayer reflective film, the protection film and the phase shift film and the phase shift film is formed directly on the protection film, wherein the phase shift film includes an Ir-based material comprising Ir as a main component, the protection film includes a Rh-based material comprising Rh as a main component, the phase shift film includes an Ir compound comprising, as a non-metal element, N and at least one element selected from the group consisting of O, C, B, and Si, the Ir compound includes N in an amount of 10 at % or less, and in the phase shift film and the protection film, a ratio ER2/ER1 of an etching rate ER2 of the phase shift film to an etching rate ER1 of the protection film is 5.0 or more.

* * * * *